United States Patent [19]
Spartiotis et al.

[11] Patent Number: 5,952,646
[45] Date of Patent: Sep. 14, 1999

[54] LOW TEMPERATURE BUMP-BONDING SEMICONDUCTOR IMAGING DEVICE

[75] Inventors: Konstantinos Evangelos Spartiotis, Athens, Greece; Jaakko Salonen, Espoo, Finland

[73] Assignee: Simage Oy, Espoo, Finland

[21] Appl. No.: 08/968,130

[22] Filed: Nov. 12, 1997

[30] Foreign Application Priority Data

Dec. 27, 1996 [GB] United Kingdom ............... 9626972

[51] Int. Cl.⁶ .................................................. H01J 40/14
[52] U.S. Cl. ................................. 250/208.1; 250/370.08
[58] Field of Search .......................... 250/208.1, 214.1, 250/214 R, 370.08, 370.14; 257/432, 446

[56] References Cited

U.S. PATENT DOCUMENTS

| | | | |
|---|---|---|---|
| 4,912,545 | 3/1990 | Go | 357/67 |
| 5,043,582 | 8/1991 | Cox et al. | 250/370.09 |
| 5,245,191 | 9/1993 | Barber et al. | 250/363.04 |
| 5,619,040 | 4/1997 | Shapiro et al. | 250/370.09 |

FOREIGN PATENT DOCUMENTS

| | | |
|---|---|---|
| 0 415 541 A1 | 3/1991 | European Pat. Off. . |
| 0 571 135 A2 | 11/1993 | European Pat. Off. . |
| 0 571 135 A3 | 11/1993 | European Pat. Off. . |
| 0 577 487 A1 | 1/1994 | European Pat. Off. . |
| 06168385 | 2/1996 | Japan . |
| 9036410 | 2/1997 | Japan . |
| 9083007 | 3/1997 | Japan . |
| WO 87/01509 | 3/1987 | WIPO . |
| WO 93/04384 | 3/1993 | WIPO . |

OTHER PUBLICATIONS (1–Page Document) Abstract for JP 63–28445 A, "Radiation Image Receiving Device," Nov. 21, 1998.

*Primary Examiner*—Que T. Le
*Attorney, Agent, or Firm*—Kenyon & Kenyon

[57] ABSTRACT

A semiconductor imaging device, for use, for example, in medical diagnosis and non-destructive testing, includes a radiation detector semiconductor substrate and a readout substrate connected to the detector by means of low temperature solder bumps A low temperature solder is preferably a lead-tin based solder having a melting point below that of eutectic lead-tin solder. Preferred embodiments of such low temperature solder include bismuth based alloys such as, for example, the eutectic (52 wt-%Bi, 32 wt-%Pb, 16 wt-%Sn) alloy which has a melting point under 100° C.

30 Claims, 3 Drawing Sheets

LOW TEMPERATURE BUMP-BONDING SEMICONDUCTOR IMAGING DEVICE

FIELD OF THE INVENTION

The invention relates to an imaging device comprising a detector substrate including a plurality of detector cells bump-bonded to a readout substrate including a corresponding plurality of readout cells and to a method of manufacturing such an imaging device.

BACKGROUND OF THE INVENTION

Examples of semiconductors used for imaging devices are: CdZnTe, Si, CdTe, $HgI_2$, InSb, GaAs, Ge, TiBr, $PbI_2$.

A detector substrate may comprise a plurality of detector cells (e.g., pixel cells) defined by metal contacts on one side of the detector. The readout substrate can comprise a corresponding plurality of readout circuits or charge coupled device (CCD) cells. The readout substrate can be bump-bonded to the detector substrate with individual pixel cells being connected to corresponding readout circuits or CCD cells by respective conductive bumps.

Imaging devices of this type can be used for medical applications involving the exposure of a patient to ionizing radiation. Such applications require high radiation absorption characteristics for the detector substrate of the imaging device. Such high radiation absorption characteristics can be provided by materials using high Z element such as CdZnTe or CdTe.

Furthermore, various medical applications require high spatial resolution. For example, mammography requires the ability to observe microcalcifications which can be under 100 microns or even under 50 microns in size. The stringent requirements imposed on imaging devices require the use of small resolution elements (pixel cells), with a large arrays of such cells being needed to generate an image of a useful size.

An important step in the fabrication of such imaging devices is the bonding of the semiconductor substrate to the readout substrate, or more precisely, the bonding of detector cells to corresponding readout cells in a one-to-one correspondence.

A semiconductor pixel imaging device is disclosed in commonly assigned and copending U.S. patent application Ser. No. 08/454,789, the entirety of which is incorporated by reference herein. As mentioned in the previous paragraph, a significant aspect of this technology is the bonding of the semiconductor substrate to the readout substrate.

Typically, prior art hybrid imaging devices such as those described in U.S. Pat. No. 5,245,191, EP-A-0 571, 135, and EP-A-0 577 187 employ indium bumps for bump-bonding a detector substrate to a readout substrate.

Indium bumps are grown on the detector metal contacts (defining the cells) and on the readout cells using evaporation. Subsequently, the two different parts are brought together, aligned, and the corresponding bumps are merged. This is also termed flip-chip joining. This cold welding technique is achieved by heating the substrates at 70–120° C. and applying mechanical pressure. For detectors comprising heat sensitive materials such as cadmium zinc telluride (CdZnTe) and cadmium telluride (CdTe) the use of indium bumps is advantageous in that the process can be carried out at a low temperature. The temperatures needed for indium bump-bonding, typically 70–120° C., fall within an acceptable range for materials such as CdZnTe and CdTe.

However, during the development of imaging devices using indium bump-bonding, non-uniform detector response has been observed near the detector edges. A plausible explanation is that indium is escaping to the detector edges thus creating undesirable contact between edge metal contacts (edge pixels) and the detector edge.

The present invention seeks to mitigate the problems of the prior art.

SUMMARY OF THE INVENTION

In accordance with a first aspect of the invention, there is provided an imaging device for imaging radiation, the imaging device comprising a semiconductor substrate including an array of detector cells which generate charge in response to incident radiation and a corresponding readout semiconductor substrate including an array of readout cells, said readout cells being connected to corresponding detector cells by means of low temperature solder bumps comprised of lead-tin based solder with a melting point below that of eutectic lead-tin solder (183° C.).

An imaging device according to the invention provides improved accuracy and uniformity as a result of the bonding process employed. In particular, the method is self-aligning in that, during heating of the structure, surface tension of the melting bump forces the detector and readout substrates to align with one another.

Although the use of solder for joining circuits together is well known in the electronics arts, the normal type of solder, the eutectic form of which is formed from 60 percent tin (Sn) and 40 percent lead (Pb) by weight, requires the use of temperatures of 183° C. or more. Such temperatures, even if applied for only a short time, damage sensitive detector substrates made of materials such as CdZnTe and CdTe.

Surprisingly, through the use of low temperature solder in accordance with the invention, the disadvantages of indium bump bonding can be avoided without causing damage to the detector substrate, even if it is made of CdZnTe or CdTe, which would be the case were conventional solder to be used.

Moreover, the use of low temperature solder avoids the need to form bumps on both the detector and readout substrates, which provides for economies of manufacture as well as improved performance and reliability. This avoids a further disadvantage of the prior art, which requires the application of indium bumps to both substrates.

Preferably the solder bumps comprise solder having a melting point under 180° C., more preferably below 120° C., and yet more preferably below 100° C. Preferably, the solder comprises an alloy of bismuth (Bi), lead (Pb) and tin (Sn).

A preferred alloy which gives a low melting point of the order of 90° C. comprises approximately 52 weight percent of Bi, approximately 32 weight percent of Pb and approximately 16 weight percent Sn.

As mentioned above, preferred embodiments employ a detector substrate of CdZnTe or CdTe because of the high energy radiation absorption characteristics of those materials. However, it will be appreciated that the invention could be used with other detector substrate materials, even if they are not as temperature sensitive as CdZnTe or CdTe. The readout chip can, for example, be a CMOS chip.

The invention also provides an imaging system comprising at least one imaging device as described above.

An imaging device as described above finds particular application for medical diagnosis and/or for non-destructive testing.

In accordance with another aspect of the invention, there is provided a method of manufacturing an imaging device having an array of image cells for imaging radiation, the imaging device comprising a detector semiconductor substrate including an array of detector cells for generating charge in response to incident radiation and a readout semiconductor substrate including an array of corresponding readout cells, the method comprising steps of: applying low temperature solder bumps to one of the substrates at positions corresponding to the image cells; aligning respective readout and detector cells to each other; and connecting the detector and readout cells by the application of heat to the low temperature solder bumps, low temperature solder preferably being a lead-tin based solder with a melting point below that of eutectic lead-tin solder.

Preferably the solder bumps are applied to the readout systems only, but they may alternatively or additionally be applied to the detector substrate.

Preferably, to assist in obtaining an accurate alloy composition for the low temperature solder, and thereby to ensure an accurate melting temperature for the low temperature solder, the step of applying low temperature solder bumps comprises applying constituent elements of the low temperature solder in required proportions at positions for the solder bumps and then applying heat to reflow the constituent elements to form the solder bumps.

BRIEF DESCRIPTION OF THE DRAWINGS

Exemplary embodiments of the invention will be described hereinafter, with reference to the accompanying drawings in which.

DETAILED DESCRIPTION

Figure 1:
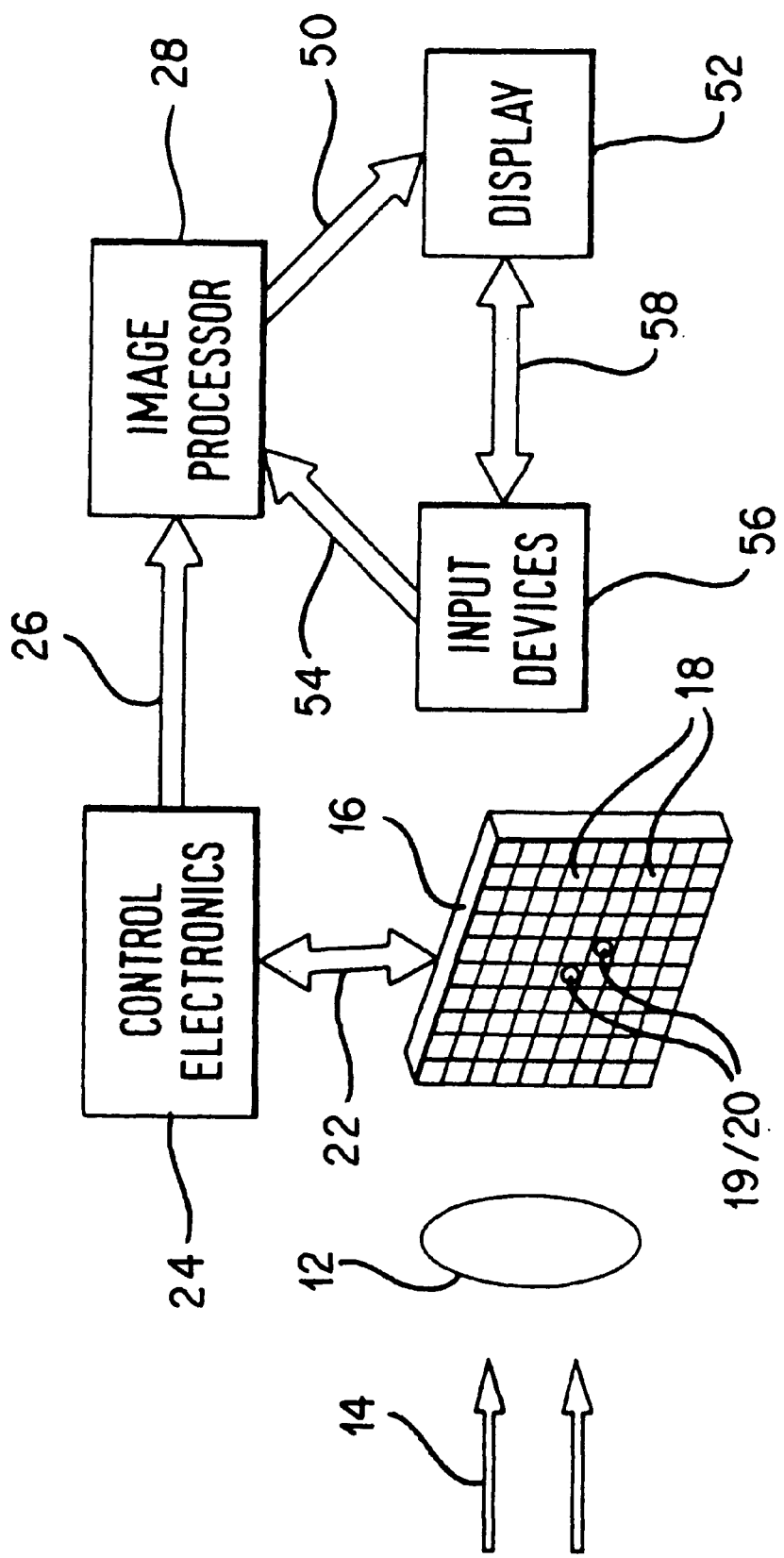
FIG. 1 is a schematic overview of an imaging system for high energy radiation imaging.

FIG. 1 is a schematic representation of an example of an imaging system 10 including an embodiment of an imaging device in accordance with the invention.

This application relates to radiation imaging of an object 12 subjected to radiation 14. In one application of the disclosed invention, the radiation may, for example, be X-ray radiation and the object 12 may, for example, be a part of a human body.

The imaging device 16 comprises a plurality of pixel cells 18. The imaging device directly detects high energy incident radiation (e.g., radiation having an energy level greater than 1 kev) such as X-rays, γ-rays, β-rays or α-rays. The imaging device is configured on two substrates, one with an array of pixel detectors 19 and one with an array of readout circuits 20, the substrates being mechanically connected to each other by low temperature solder bumps comprised of lead-tin based solder with a melting point below that of eutectic lead-tin solder.

Control electronics 24 includes processing and control circuitry for controlling the operation of the imaging device, or an array of imaging devices. The control electronics 24 enables the readout circuits 20 associated with individual pixel cells 18 to be addressed (e.g., scanned) for reading out charge from the readout circuits 20 at the individual pixel cells 18. The charge readout is supplied to Analog to Digital Converters (ADCs) for digitization and Data Reduction Processors (DRPs) for processing the digital signal.

The processing which is performed by the DRPs can involve discriminating signals which do not satisfy certain conditions such as a minimum energy level. This is particularly useful when each readout signal corresponds to a single incident radiation event. If the energy corresponding to the measured signal is less than that to be expected for the radiation used, it can be concluded that the reduced charge value stored results from scattering effects. In such a case, the measurement can be discarded with a resulting improvement in image resolution.

The control electronics 24 is further interfaced via a path represented schematically by the arrow 26 to an image processor 28. The image processor 28 includes data storage in which it stores digital values representative of the charge values read from each pixel cell along with the position of the pixel cell 18 concerned. The image processor 28 builds up an image for display. It then reads the values stored for the selected pixel positions to cause a representation of the data to be displayed on a display 52 via a path represented schematically by the arrow 50. The data can, of course, be printed rather than, or in addition to being displayed and can be subjected to further processing operations. Input devices 56, for example, a keyboard and/or other typical computer input devices, are provided for controlling the image processor 28 and the display 52 as represented by the arrows 54 and 58.

Figure 2:
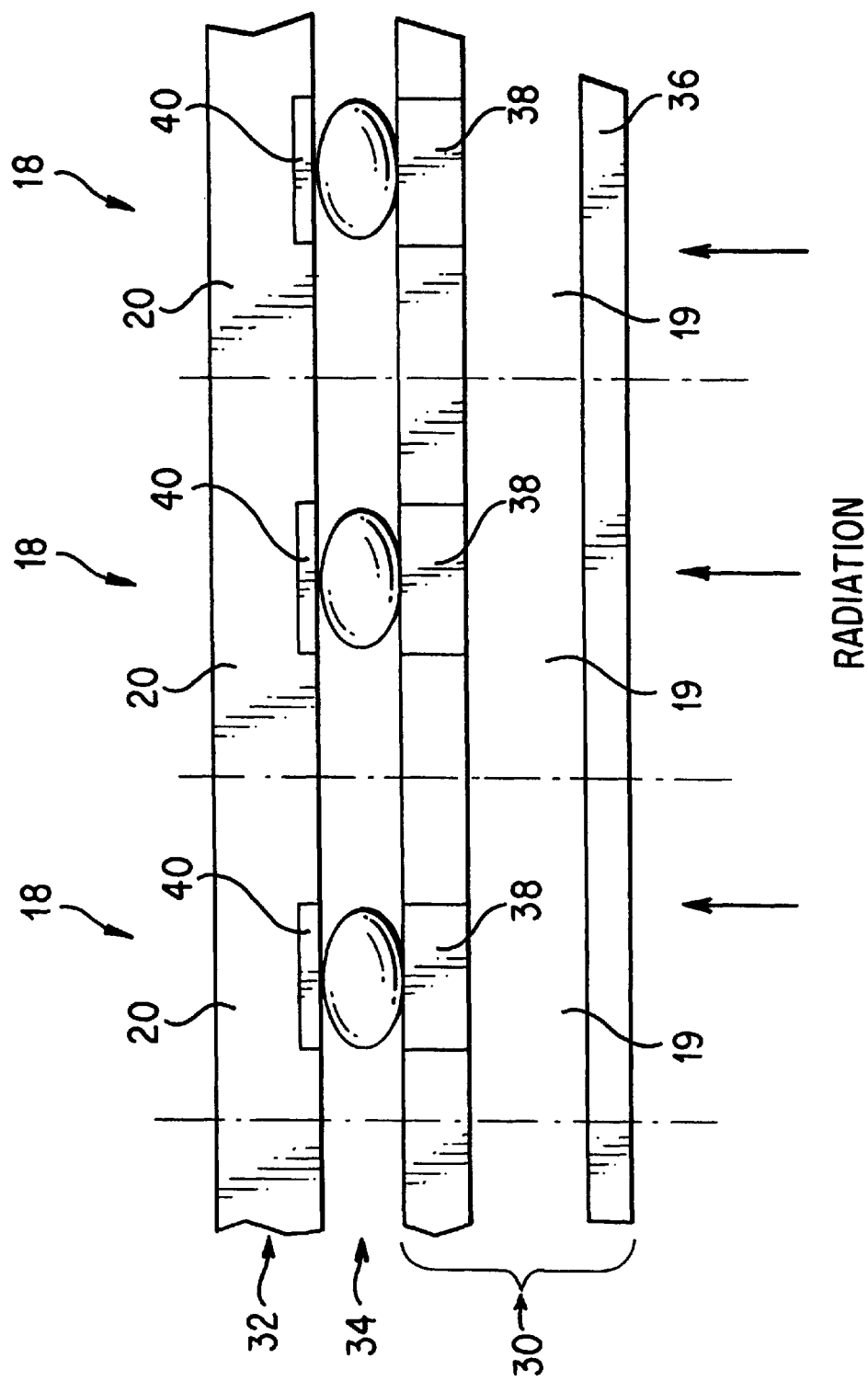
FIG. 2 is a schematic cross sectional diagram of an example of imaging device in accordance with the invention.

FIG. 2 is a schematic cross section of part of an imaging device 16. In this example, the imaging device 16 comprises an image detector substrate 30 connected to an image circuit substrate 32 by means of solder bumps 34. A pixel detector 19 of each pixel cell 18 is defined on the detector substrate 30 by a continuous electrode 36 which applies a biasing voltage and pixel location electrodes (contact pads) 38 to defined a detection zone for the pixel cell 18. Corresponding pixel circuits 20 on the image circuit substrate 32 are defined at locations corresponding to the electrodes 38 (i.e. to the pixel detectors 19). Electrodes (contact pads) 40 for the pixel circuits 20 are electrically connected to the corresponding electrodes 38 by the solder bumps 34. In this manner, when charge is generated in a pixel detector 19 in response to incident radiation, this charge is passed via the solder bumps 34 to the corresponding pixel circuit 20.

Thus, each pixel cell 18 of the imaging device 16 is in effect defined on the substrate by electrodes (not shown) which apply a biasing voltage to define a detection zone (i.e., the pixel detector 19) for the pixel cell 18. Corresponding readout circuits on the readout substrate can comprise, for example, active pixel circuits 20 as described in commonly assigned and copending U.S. patent application Ser. No. 08/454,789, the entirety of which is incorporated by reference herein. The pixel detectors 19 are formed with a detection zone such that, when a photon is photo-absorbed in the semiconductor substrate 16 at a pixel cell 18 creating an electric charge or when a charged radiation ionizes the detection zone of the semiconductor substrate 16 at a pixel cell 18, an electric pulse flows from the semiconductor 16 at a pixel cell 18, an electric pulse flows from the semiconductor detection zone to the readout circuit 20 for that pixel cell 18 through the solder bump 34 for that pixel cell.

In order to provide efficient charge absorption for X-rays and other high energy radiation typically having energies in excess of 1 keV, the use of high absorption semiconductor materials for the detector substrate is desirable, for example, CdZnTe or CdTe. In this case, low temperature processes used during manufacture avoid damaging the temperature sensitive substrate.

Thus, through the use of low temperature soldering (under 180°) sensitive materials such as CdZnTe or CdTe can be used without impairing the characteristics of the detector substrate.

An example of an imaging device in accordance with the invention, therefore comprises a semiconductor substrate and a readout substrate, the substrates comprising detecting and readout cells respectively, each detecting cell being connected to a corresponding (one-to-one correspondence) readout cell with low temperature solder bumps.

By way of example, monolithic detectors of dimensions 12.2×4.2 mm$^2$ (41,000 pixels of 35 microns size) and 18.9×9.6 mm$^2$ (130,000 pixels of 35 microns size) connected to a CMOS chip via low temperature solder bumps may be constructed. However, the actual size of the pixel circuit and the pixel detector will depend on the application for which the imaging device is intended, and the circuit technology used.

Such an imaging device will then exhibit the necessary uniform performance over a large number of bonded cells thus meeting the criteria (high absorption efficiency, high spatial resolution) for use in medical diagnosis, for example mammography, dental imaging, chest X-rays, conventional X-rays, fluoroscopy, computerized tomography, nuclear medicine and non-destructive testing.

Low temperature solder bumps may be as small as 5 microns in diameter but may be larger. A soldering material with low melting point will be a suitable low temperature solder. A low temperature solder is a solder which can be melted at a temperature which will mitigate or prevent damage or deterioration of a temperature sensitive detector substrate such as CdZnTe or CdTe. A low temperature solder has a melting point of preferably less than 180° C., more preferably less than 120° C. and yet more preferably less than 100° C.

One example of such a low temperature solder material is a ternary bismuth-lead-tin (BiPbSn) alloy. The melting point of a eutectic (52 wt % Bi, 32 wt % Pb, 16 wt % Sn) alloy is, for example, under 100° at about 90° C. The percentages of the composition are each approximate. The alloy may be made solely of the three elements mentioned in approximately the proportions indicated to a total of 100 wt %. However, the alloy composition may be varied to optimize wetting, melting point and/or thermal expansion on solidification. For example, the proportions of the component elements may be varied and/or other component elements may be chosen for addition to or substitution for the elements mentioned.

FIG. 3 is a schematic representation of a method of manufacturing an imaging device as described above. FIG. 3A represents a step of providing a readout substrate 32 with an array of contact pads 40 for connections to corresponding contact pads 38 on a detector substrate 30 (FIG. 3C).

Figure 3A:
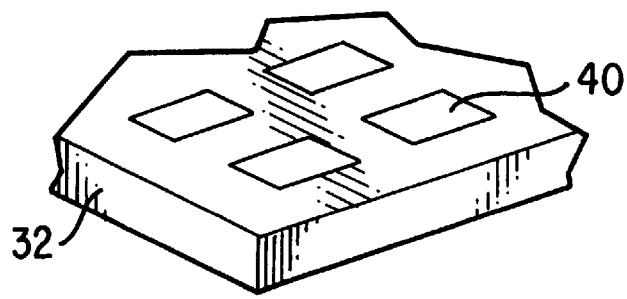
FIGS. 3A–3D are schematic diagrams illustrating a method of manufacturing such an imaging device in accordance with invention.

FIG. 3A represents the provision of solder bumps 34 on the contact pads 40. The solder bumps can be formed, for example, by vacuum evaporation or electroplating for depositing the metal alloy solder material on respective contact pads. A metal or photoresist mask may be used. To attain an accurate alloy composition, each constituent metal may be deposited separately but then, prior to joining, the structure is subjected to a process step in which the bumps are reflowed, (subjected to a temperature higher than the alloy's melting point) thus homogenizing the bump composition at each contact pad position. It is not necessary to exceed significantly the melting point of the alloy, in order to reflow the layered "sandwich" structure.

Figure 3B:
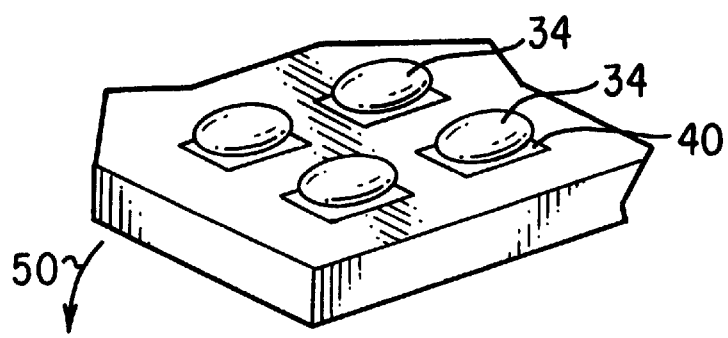
Figure 3C:
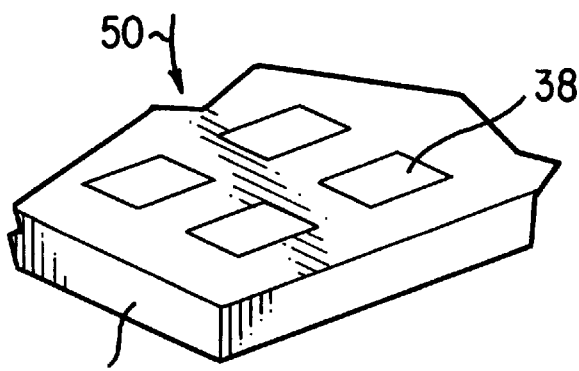

In a preferred embodiment of the invention, the bump is deposited on the readout chip side only as shown in FIG. 3B so as to spare the detector from any harmful deposition and for economy of tasks (avoiding growing bumps on the detector substrate).

Alternatively, task economy could also be achieved by depositing the solder bumps 34 on the detector substrate 30 (FIG. 3C) instead, although this would increase the risk of possible damage to the detector substrate.

As a further alternative, bumps can be grown on both the readout substrate 32 and on the detector substrate 30 if a suitable bump volume cannot be attained otherwise.

A solderable (solder wettable) pad can be formed underneath the solder bump. This pad can be deposited prior to bump deposition using the same mask. It is not necessary to use the same technique for depositing both the bump and the under-bump metallurgy. An additional advantage provided by low temperature solder is that it allows for thinner under-bump metallurgies, as well as providing the choice of using otherwise unusable metals, as the rate at which the under-bump metallurgy dissolves into the bump is proportional to temperature.

Guard rings, also made of solder, and in addition to their electrical function, may be used around the pixel array hermetically to seal the pixel area solder joints from external atmosphere. Dams and/or shields, for electrical and/or mechanical purposes, may also be constructed.

The bumps need not all be of the same size. A small number of relatively large bumps may be used to aid the self-alignment of the main pixel array with a large number of relatively small bumps.

Once the solder bumps are formed, then the readout substrate 34 (FIG. 3B) is flip-chip joined to the detector substrate (FIG. 3C), as represented by the arrow 50 with the controlled application of heat at a temperature and for a time sufficient to "soften" the solder bumps sufficiently to enable connection of the semiconductor substrates, but not sufficient to cause damage to the semiconductor substrates. Such heating can take place over a period of time varying from, for example, a few seconds to several minutes. In this manner joining of the respective contact pads 38, 40 on the detector substrate 30 and the readout substrate 32, respectively, can be achieved.

Figure 3D:
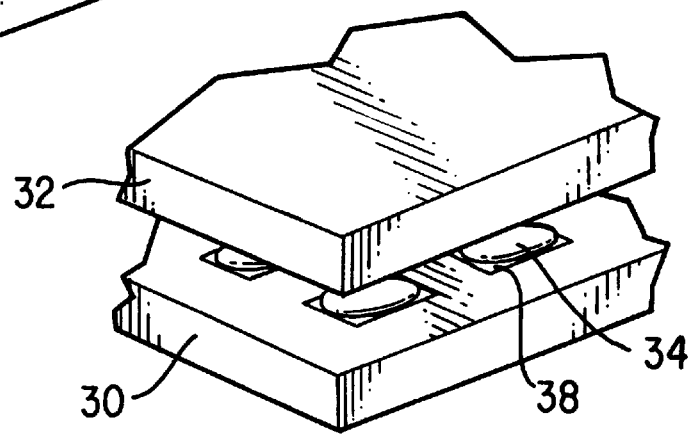

FIG. 3D represents one corner of the joined hybrids imaging device 16.

Thus a semiconductor imaging device, for use in, for example, medical diagnosis and non-destructive testing, has been described. The semiconductor imaging device includes a radiation detector semiconductor substrate and a readout substrate connected to the detector by means of low temperature solder bumps. A low temperature solder should have a melting point under about 180° C., preferably less than 150° C., more preferably less than 120° C. and yet more preferably less than 100° C. Examples of such low temperature solders are provided by bismuth-based alloys of lead and tin, for example the eutectic alloy, which is composed of approximately 52 wt % Bi, approximately 32 wt %Pb and approximately 16 wt % Sn to 100 wt % and has a melting point under 100° C.

An imaging device in accordance with the inventions disclosed herein can be used in applications such as medical diagnosis, for example for mammography, dental imaging, chest X-rays, fluoroscopy, computerized tomography, nuclear medicine and so on. An imaging device in accordance with these inventions can also be used in applications such as non-destructive testing.

The foregoing is a detailed description of particular embodiments of the invention. The invention embraces all alternatives, modifications and variations that fall within the letter and spirit of the claims, as well as all equivalents of the claimed subject matter. Although particular examples and combinations of materials, configurations and methods of manufacture for other embodiments of the invention have been described, other examples, combinations, configurations and methods and other embodiments are possible within the spirit and scope of the invention.

What is claimed is:

1. An imaging device for imaging radiation, said imaging device comprising a semiconductor substrate including an array of detector cells which generate charge in response to incident radiation and a corresponding readout semiconductor substrate including an array of readout cells, said readout cells being connected to corresponding detector cells by low temperature solder bumps, wherein said low temperature solder bumps comprise lead-tin based solder having a melting point below that of eutectic lead-tin solder.

2. The imaging device of claim 1 wherein said solder bumps comprise solder having a melting point under 180° C.

3. The imaging device of claim 1 wherein said solder bumps comprise solder having a melting point under 120° C.

4. The imaging device of claim 1 wherein said solder bumps comprise solder having a melting point under 100° C.

5. The imaging device of claim 1 wherein said detector substrate comprises CdTe.

6. The imaging device of claim 1 wherein said solder bumps comprise solder including Bi, Pb, and Sn.

7. The imaging device of claim 1 wherein said solder bumps comprise solder comprised of approximately 52 percent Bi, approximately 32 percent Pb and approximately 16 percent Sn.

8. The imaging device of claim 1 wherein said solder bumps comprise solder comprised of Bi and Pb and between 1 and 65 percent Sn.

9. The imaging device of claim 1 wherein said solder bumps comprise solder comprised of Bi and Sn and between 1 and 75 percent Pb.

10. The imaging device of claim 1 wherein said solder bumps comprise solder comprised of Pb and Sn and between 1 and 75 percent Bi.

11. The imaging device of claim 1 wherein said solder bumps comprise a solder alloy including at least one of In, Cd, Ga, Zn, Ag or Au.

12. The imaging device of claim 1 wherein said detector substrate comprises CdZnTe.

13. An imaging system comprising:
an imaging device of imaging radiation, said imaging device comprising an array of detectors which generate charge in response to incident radiation and an array for readout devices connected to corresponding elements of said array of detectors by low temperature solder bumps comprising lead-tin based solder having a melting point below that of eutectic lead-tin solder;
control electronics operably coupled to said imaging device for controlling reading by said readout devices and processing output from said readout devices; and
an image processor responsive to processed output from said control electronics for generating an image therefrom.

14. The imaging system of claim 13 wherein said control electronics comprise analog to digital converters.

15. The imaging system of claim 13 wherein each of said detectors is a detector cell on a semiconductor substrate.

16. The imaging system of claim 13 wherein each of said readout devices is a readout cell on a next semiconductor substrate.

17. The imaging system of claim 14 wherein said control electronics further comprise data reduction processors.

18. A method of manufacturing an imaging device comprising a detector semiconductor substrate including an array of detector cells for generating charge in response to incident radiation and a readout semiconductor substrate including an array of readout cells, one of said detector cells and one of said readout cells forming an image cell, said method comprising:
applying low temperature solder bumps comprising lead-tin based solder having a melting point below that of eutectic lead-tin solder to one of said substrates at positions corresponding to said image cells;
aligning respective readout and detector cells to each other; and
connecting said detector and said readout cells by the application of heat to said low temperature solder bumps.

19. The method of claim 18 wherein said solder is an alloy having a plurality of constituent elements and said step of applying low temperature solder bumps comprises:
applying constituent elements of said low temperature solder in required proportions at positions for said solder bumps; and
applying heat to reflow said constituent elements to form said solder bumps.

20. The method of claim 18 wherein said solder bumps are applied to said readout substrate at positions corresponding to said readout cells.

21. The method of claim 18 wherein said solder bumps are applied to said readout substrate at positions corresponding to said readout cells and to said detector substrate at positions corresponding to said detector cells.

22. The method of claim 18 wherein said solder bumps comprise solder having a melting point under 180° C.

23. The method of claim 18 wherein said solder bumps comprise solder having a melting point under 120° C.

24. The method of claim 18 wherein said solder bumps comprise solder having a melting point under 100° C.

25. The method of claim 18 wherein said solder bumps comprise a solder alloy of Bi, Pb, and Sn.

26. The method of claim 18 wherein said solder bumps comprise a solder alloy of approximately 52 percent Bi, approximately 32 percent Pb, and approximately 16 percent Sn.

27. The method of claim 18 wherein said solder bumps comprise solder comprised of Bi and Pb and between 1 and 65 percent Sn.

28. The method of claim 18 wherein said solder bumps comprise solder comprised of Bi and Sn and between 1 and 75 percent Pb.

29. The method of claim 18 wherein said solder bumps comprise solder comprised of Pb and Sn and between 1 and 75 percent Bi.

30. The method of claim 18 wherein said solder bumps comprise a solder alloy including at least one of In, Cd, Ga, Zn, Ag or Au.

* * * * *